United States Patent [19]

Ishikawa

[11] Patent Number: 5,367,495
[45] Date of Patent: Nov. 22, 1994

[54] RANDOM ACCESS MEMORY HAVING CONTROL CIRCUIT FOR MAINTAINING ACTIVATION OF SENSE AMPLIFIER EVEN AFTER NON-SELECTION OF WORD LINE

[75] Inventor: Toru Ishikawa, Tokyo, Japan

[73] Assignee: NEC Corporation, Tokyo, Japan

[21] Appl. No.: 997,186

[22] Filed: Dec. 28, 1992

[30] Foreign Application Priority Data

Dec. 27, 1991 [JP] Japan .................................. 3-360289

[51] Int. Cl.[5] ............................................... G11C 7/00
[52] U.S. Cl. ..................................... 365/239; 365/235;
365/207; 365/238.5; 365/230.03; 365/230.09
[58] Field of Search ....................... 365/239, 235, 238.5,
365/230.03, 230.09, 230.06, 207, 233

[56] References Cited

U.S. PATENT DOCUMENTS 5,185,720  2/1993  Vaillancourt et al. ........... 365/238.5
5,222,047  6/1993  Matsuda et al. .................... 365/239

OTHER PUBLICATIONS

T. A. Rehage and S. E. Stucka, Enhanced programmable memory address registers, IBM Technical Disclosure Bulletin vol. 24 No. 8, Jan. 1982, pp. 4183–4184.
Data Sheet from NEC Data Book, µPD424400 Dymanic CMOS RAM, pp. 6-199–6-203 and 6-210–6-211, 1991.

Primary Examiner—Eugene R. LaRoche
Assistant Examiner—Huan Hoang
Attorney, Agent, or Firm—Sughrue, Mion, Zinn, Macpeak & Seas

[57] ABSTRACT

A MOS memory device operating at high speed which is so constructed as to hold the sense amplifier activating signals SAP and SAN at high potential and at low potential, respectively, even after the completion of a memory access, and keep the sense amplifier 30a in activated state to hold read data from memory cells. This memory device includes a block decoder which designates mutually different cell array blocks synchronized with a row selection signal RAS and a column selection signal CAS so that it is possible at the time of input of the column selection signal CAS to execute write/read operation in page mode that extends over the cell array blocks.

5 Claims, 7 Drawing Sheets

RANDOM ACCESS MEMORY HAVING CONTROL CIRCUIT FOR MAINTAINING ACTIVATION OF SENSE AMPLIFIER EVEN AFTER NON-SELECTION OF WORD LINE

BACKGROUND OF THE INFORMATION

1. Field of the Invention

The present invention relates to a random access memory (RAM) and, more particularly, to a high storage capacity RAM in which a memory cell array consists of a plurality of blocks arranged in the direction of digit lines, each of these blocks being equipped with a row decoder, a column decoder and a sense amplifier.

2. Description of the Prior Art

A high storage capacity RAM as an integrated circuit device includes in general a plurality of blocks arranged in the digit line direction in order to facilitate a pattern layout and to alleviate restrictions on the functions of the digit system circuit such as a column decoder and a sense amplifier. For example, the memory cell array of a 1 megawords×4 bits/word RAM (1M×4 bit RAM) consists of four blocks each having a matrix construction of 256 words×4,096 bits/word. Each of these blocks has a row decoder, a column decoder and a sense amplifier arrayed in the direction of word lines.

Further, the RAM has a block decoder operating in response only to a row selection signal RAS. The output of the block decoder is supplied to the row decoders and the column decoders to designate one block to be accessed. In a block thus designated, access to the memory cells is accomplished by selecting one of 256 word lines under control of the row decoder and further selecting four lines of 4,096 digit lines under control of the column decoder. On the completion of the access, the potentials of the selected word line and the selected digit lines go back to the nonselective levels.

The RAM is frequently subjected to an access mode in which one address is accessed continuously. Such an access mode is called "page mode" or "static column mode" (represented collectively by "page mode" hereinafter). The continuous address in this case is generally designated by consecutive column addresses for the same row address. Accordingly, redriving of the word lines is not needed so long as the access address remains at an address on the same word line, and in that case it has only to be done to sequentially read data from the memory cell onto the digit lines or to introduce write data to the digit lines from the outside to write the same to the memory cells.

Furthermore, a certain address range is often accessed repeatedly in response to repetition in execution of a subroutine program. In this case, depending upon the scale of the address range, the system recurs to the address on the word line that was accessed last.

However, in the above-mentioned conventional RAM, the potentials of the digit lines return to the values prior to the access every time the access is completed. For this reason, when the read operation is to be carried out by recurring to the address on the word line accessed last, it is necessary to start allover again from the driving of the word lines. As a result, the memory access time as well as the memory access cycle time are prolonged accordingly.

Moreover, since address information for selecting one digit line within one block is supplied to a column decoder, the memory access operation in the page mode for an address range that extends over a plurality of blocks is impossible.

BRIEF SUMMARY OF THE INVENTION

Objects of the Invention

It is an object of the invention to provide a RAM having enhanced access speed.

It is another object of the invention to provide a RAM which can extend an operable address range in a page mode.

Summary of the Invention

A RAM according to this invention is characterized by comprising a data hold circuit which holds data on digit lines of an access object even after the completion of the access. Further, there is provided a block decoder which can designate two blocks different from each other in response to a row selection signal RAS and a column selection signal CAS.

Preferably, the RAM of the invention includes a register provided respectively for each of the blocks, in addition to the data hold circuit and the block decoder. This register holds address information which specifies a word line that became the object of the last access in the block according to an indication of the block decoder. Write to the memory cells is not executed at this time, but is executed based on the address information held in the register when the same block is accessed next and before the access to the same block is performed. The potential of the word line recurs for every memory cell access analogous to the conventional RAM.

It is further preferable that the RAM according to the invention includes the data hold circuit, the block decoder and the register, and has a construction in which the potential of the word line will not recur even after the completion of the memory access.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
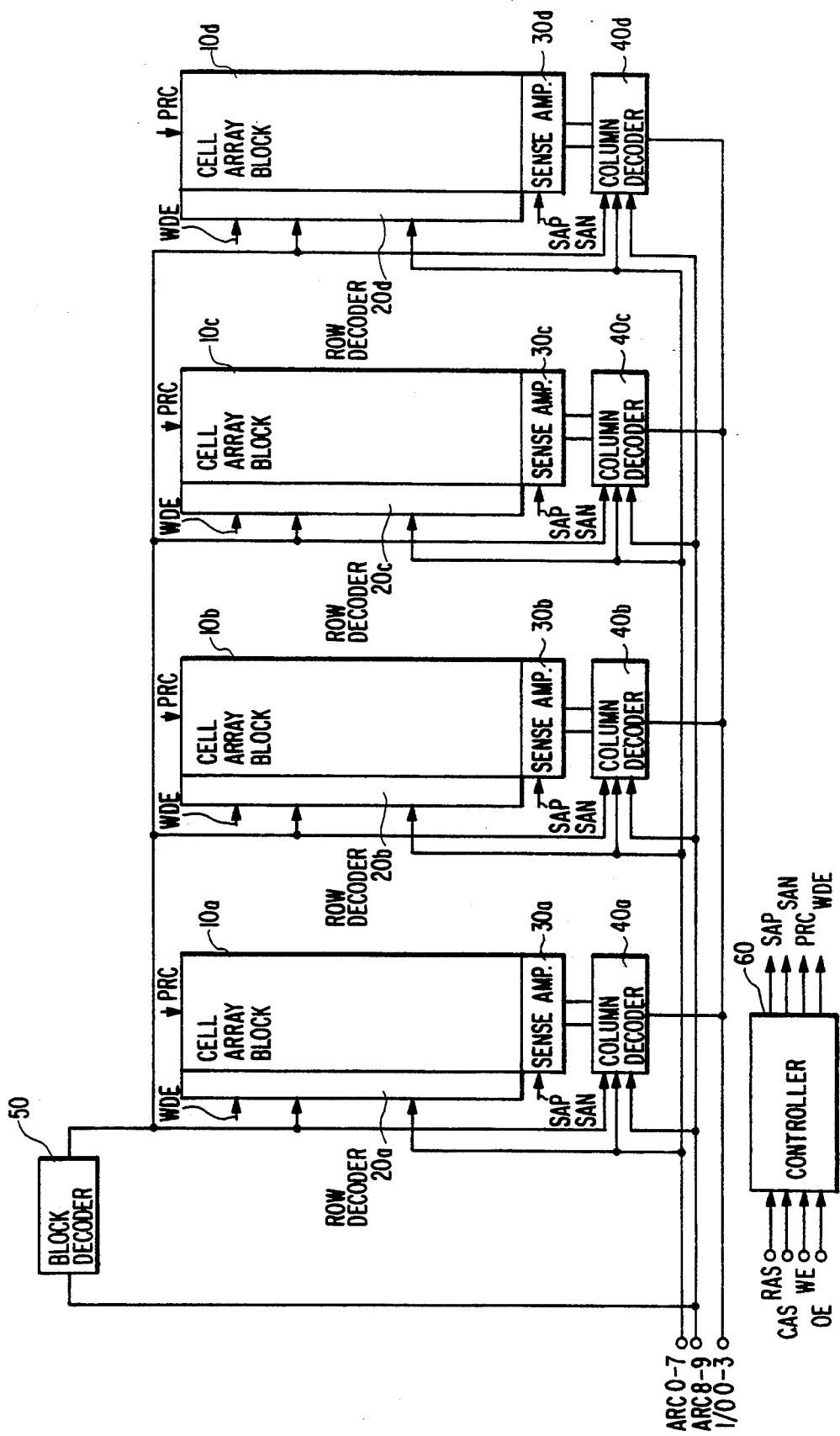
FIG. 1 is a block diagram of an example of the conventional RAM.

Referring to FIG. 1, there is shown a block diagram of a conventional dynamic RAM having 4 megabit capacity and being constructed as an integrated circuit device. In particular, this RAM is a 1M×4 bit dynamic RAM which carries out data write or read operation in the unit of 4 bits. A memory cell array of this dynamic RAM consists of four cell array blocks 10a, 10b, 10c and 10d that are accessed with mutually staggered timings as will be described later. Each of these cell array blocks consists of memory cells arranged in matrix form of 256 rows×4,096 columns. Each of the memory cells is a so-called one-transistor memory cell and this requires a periodic refreshing to maintain the data stored therein. The blocks 10a, 10b, 10c and 10d are accompanied with row decoders 20a, 20b, 20c and 20d, sense amplifiers 30a, 30b, 30c and 30d, and column decoders 40a, 40b, 40c and 40d, respectively. In the following, the description will be made on the cell array block 10a, but the description will be applicable as it is to other cell array blocks 10b, 10c and 10d.

The row decoder 20a selects one of the 256 rows in the cell array block 10a. The sense amplifier 30a amplifies the data read out of the 4,096 memory cells connected to the selected word line or transfers data to be written thereto. The column decoder 40a selects four of the 4,096 memory cells thus selected.

The RAM further includes a block decoder 50 which selects one of the cell array blocks 10a, 10b, 10c and 10d, and a controller 60 which generates control signals necessary for performing data read and write operations in response to a row selection signal RAS, a column selection signal CAS, a write enable signal WE and a chip enable signal OE.

When the chip enable signal OE is activated, the RAM is brought into an operable state. First, row address information having 8-bit address codes ARC0–ARC7 and 2-bit address codes ARC8 and ARC9, which are supplied externally in synchronism with the row selection signal RAS, is introduced to the row decoders 20a to 20d and the block decoder 50, respectively. The output of the block decoder 50 is supplied in common to the row decoders 20a to 20d and the column decoders 40a to 40d. As a result, one word line is selected in the memory cell array block 10a, for example.

Next, column address information having 8-bit address codes ARC0–ARC7 and 2-bit address codes ARC8 and ARC9, which are externally supplied in synchronism with the column selection signal CAS, is introduced to the column decoders 40a to 40d. Since the column decoder 40a is already designated by the output of the block decoder 50 in the above example, four of the 4,096 digit lines, i.e. four memory cells in the cell array block 10a are selected by the decoder 40a.

The discrimination between the read operation and the write operation is designated by the write enable signal WE. In the time of the read operation, the data read from the four memory cells designated by the word digit lines are amplified by the sense amplifier 30a and then outputted to the outside through I/O0–I/O3 as 4-bit output data. In the write operation, on the other hand, 4-bit data on I/O0–I/O3 supplied from the outside are written to the designated four memory cells. When access to one word line is completed, the word line and the sense amplifier 30a are inactivated, and the data on the digit lines is also annihilated.

Thus, when a current read access is completed to initiate a next read access for other memory cells, the data on the digit lines are erased even if the same word line is selected by the next read access. The word line is thus energized again by the next access. This means that quick access is hindered accordingly. In other words, in the conventional RAM a quick access such as in the page mode is limited to data accessible by the same word line within the same cell array block, and shift to other cell array block is not possible.

Figure 2:
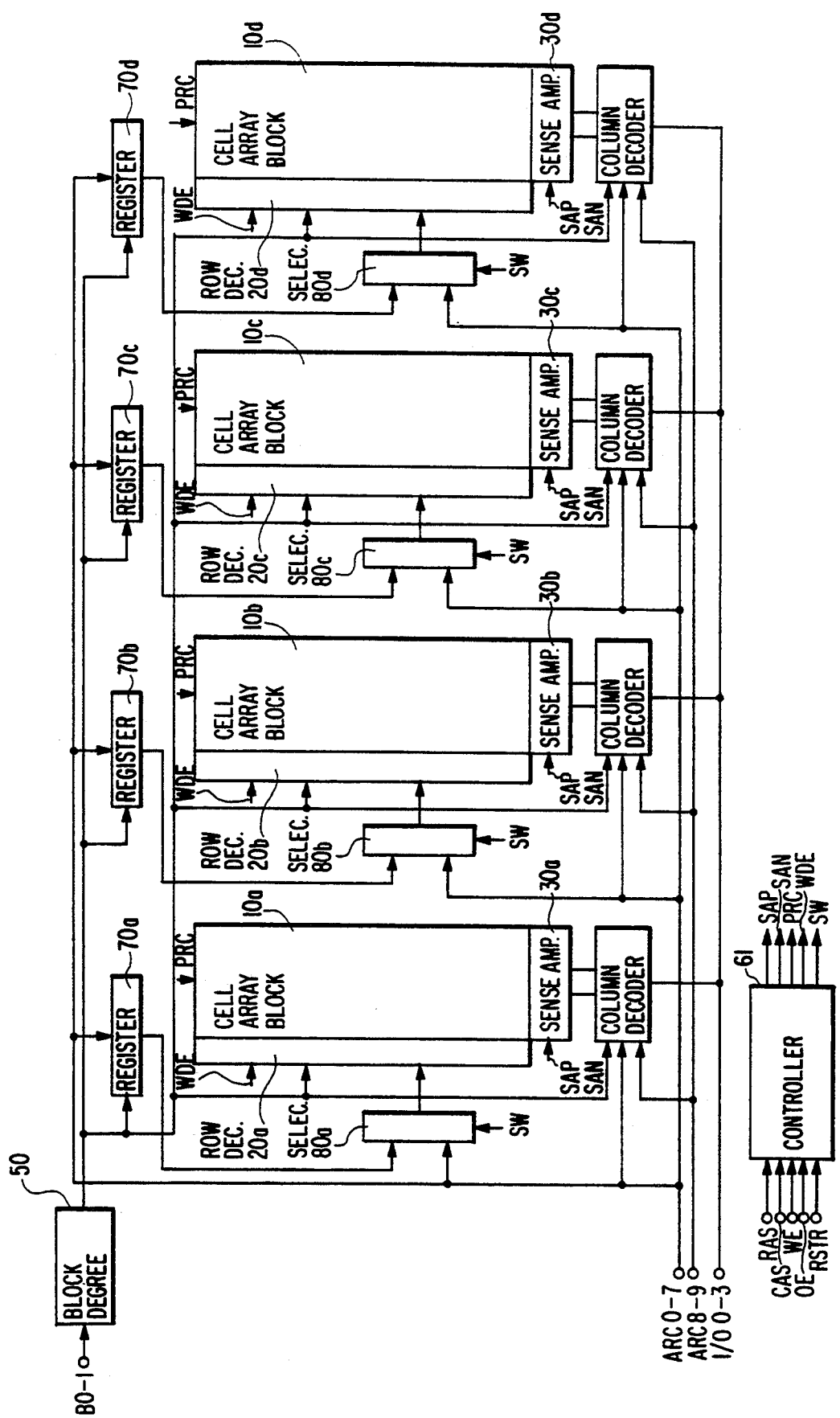
FIG. 2 is a block diagram representative of a first embodiment of the invention.

Referring to FIG. 2, there is shown a block diagram representative of a first embodiment, in which the same reference numerals are assigned to the same constituents as those shown in FIG. 1. This RAM further includes registers 70a, 70b, 70c and 70d, and selectors 80a, 80b, 80c and 80d, that are provided in one-to-one correspondence to the cell array blocks 10a, 10b, 10c and 10d. Moreover, the controller 61 has a function which is different in part from that of the controller 60 shown in FIG. 1, as will be described later.

The block decoder 50 receives 2-bit cell array block codes B0 and B1 and supplies its output in common to the row decoders 20a–20d, the column decoders 40a–40d and the registers 70a–70d. The cell array block codes B0 and B1 can respectively take different values in synchronism with the row selection signal RAS and the column selection signal CAS. Consequently, a continuous operation in page mode extending over the cell array blocks 10a–10d becomes possible, which will be described later in detail. The register 70a, 70b, 70c or 70d selected by the block decoder 50 holds 8-bit address codes ARC0–ARC7 supplied in synchronism with the row selection signal RAS. Since the holding of the address codes ARC0–ARC7 will be maintained even after access is shifted to another cell array block, these registers 70a–70d store respectively the address codes ARC0–ARC7 of the last access in the cell array blocks 10a–10d and supply them to the selectors 80a–80d which also receive the address codes ARC0–ARC7 supplied in synchronism with the row selection signal RAS and introduce them to the row decoders 20a to 20d. When a restore signal RSTR, which will be described later in detail, is supplied to the controller 61, the selectors 80a–80d select and supply the contents held in the registers 70a–70d to the decoders 20a to 20d in response to the low-active switching signal SW.

Figure 3:
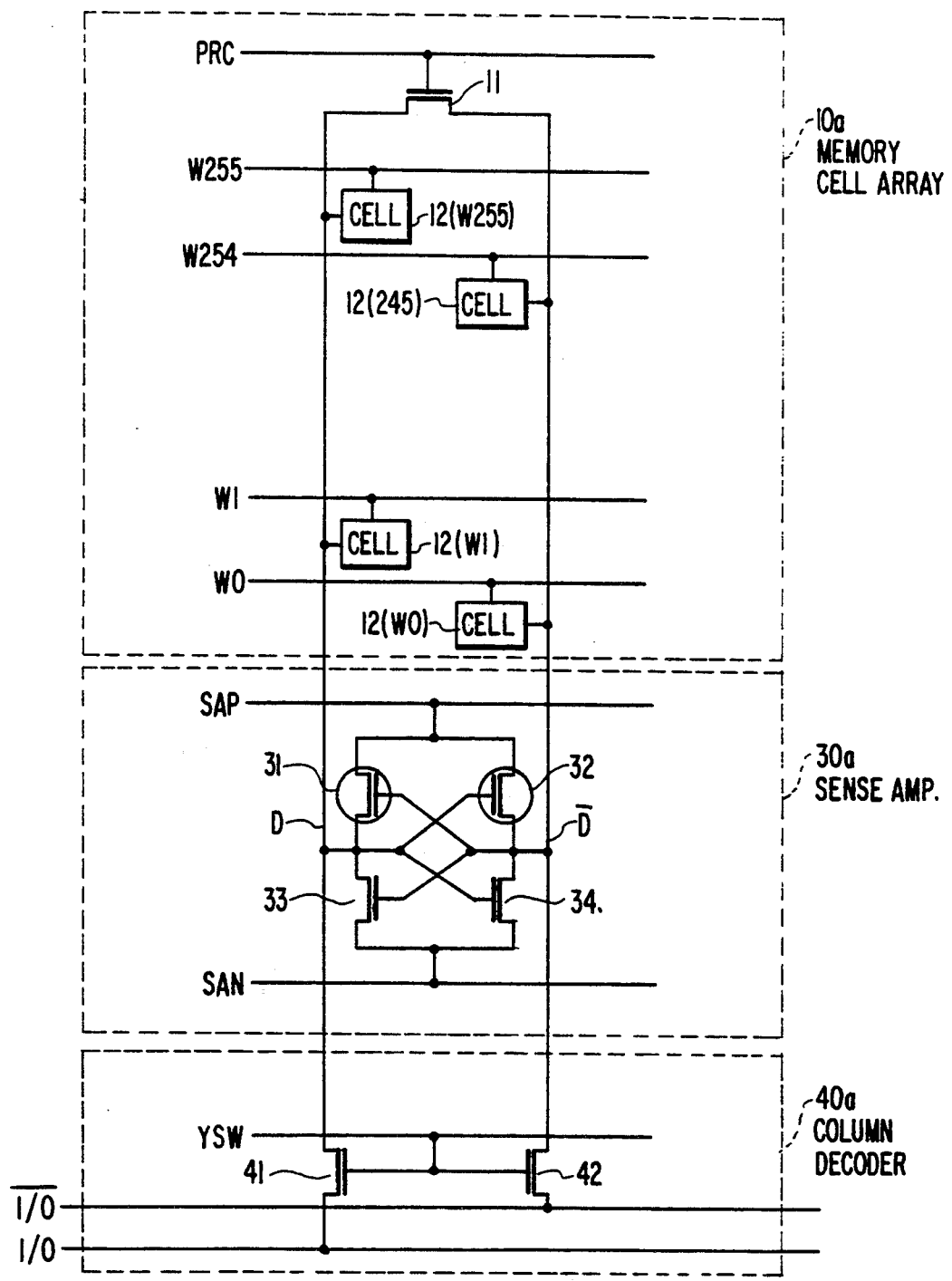
FIG. 3 is a circuit diagram representing a part of the digit system circuit in the embodiment shown in FIG. 2.

Turning now to FIG. 3, there are shown the circuit construction of the cell array block 10a, the sense amplifier 30a and the column decoder 40a for a pair of digit lines (actually, the cell array block 10a has 4,096 digit line pairs, but only one pair out of them is shown in the figure). There are only four sets of the input and output signal lines I/O and $\overline{I/O}$ owing to an external input and output interface, and 1,024 switches are arranged for each set as illustrated for a pair of N-type MOS transistors 41 and 42 for the column decoder 40a. The column signal YSW serves as an input common to four switches located at the same position of each set.

Figure 4:
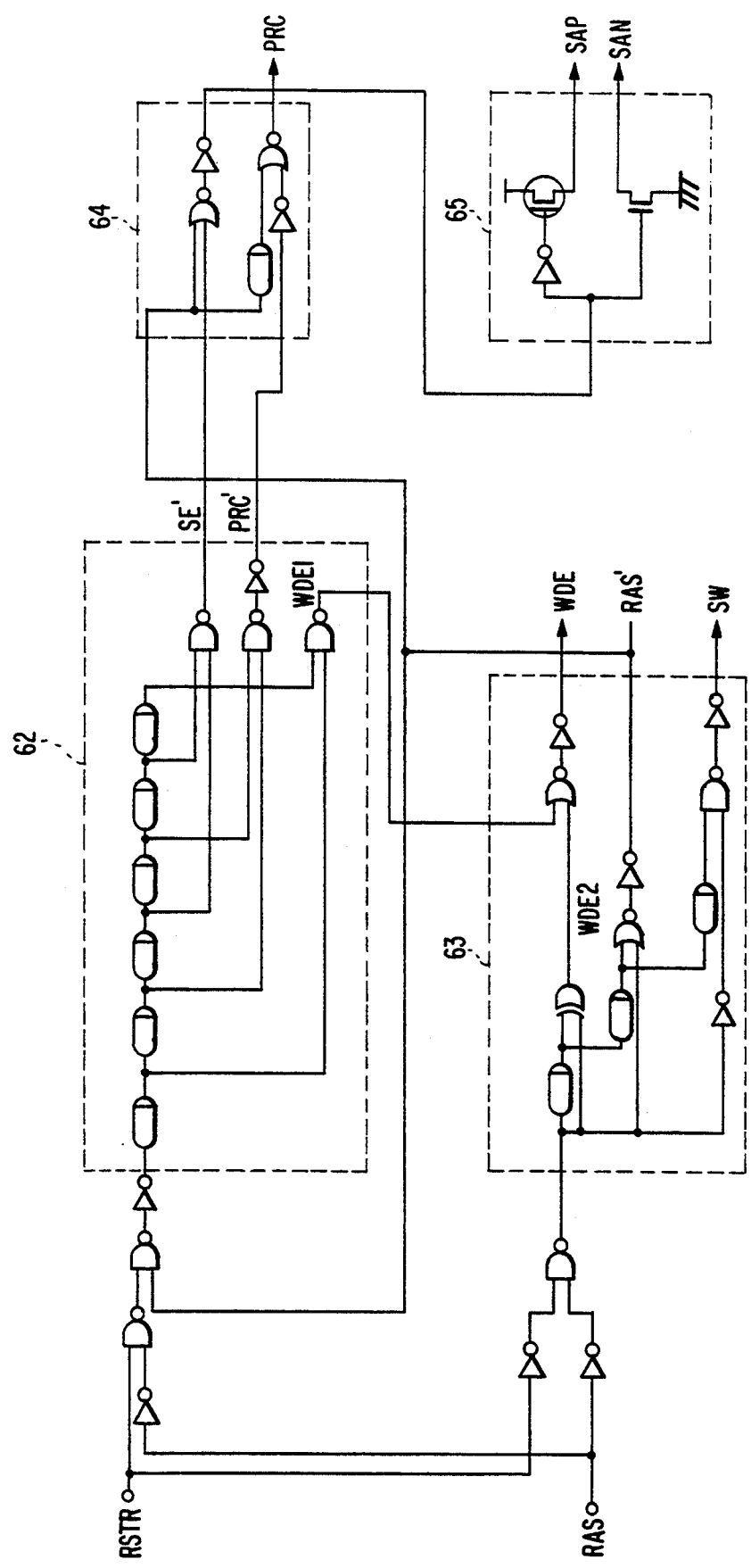
FIG. 4 is a datailed circuit diagram representing a principal part of the controller in the embodiment shown in FIG. 2.

Referring to FIG. 4 showing a detailed circuit for the principal part of the controller 61, this circuit consists of an RAS system timing generation circuit 62 which generates intermediate signals SE', PRC' and WDE1 from the row selection signal RAS and the restore signal RSTR, a word for restore control circuit 63 which generates a word line activating signal WDE, a switching signal SW and an intermediate signal RAS' from the row selection signal RAS, the restore signal RSTR and the intermediate signal WDE1, a sense amplifier activation state hold circuit 64 which generates a precharge signal PRC and an intermediate signal SE in response to the intermediate signals SE', PRC' and RAS' that are provided corresponding to each of the cell array blocks 10a–10d, and a sense amplifier activation circuit 65 which generates sense amplifier activating signals SAP and SAN in response to the intermediate signal SE that is provided corresponding to each of the cell array blocks 10a–10d. The word line activating signal WDE is supplied to the row decoders 20a–20d, the switching signal SW is supplied to the selectors 80a–80d, the precharge signal PRC is supplied to the cell array blocks 10a–10d, and the sense amplifier activating signals SAP and SAN are supplied to the sense amplifiers 30a–30d.

Next, the operation of the embodiment will be described with reference to FIGS. 2 to 4 and further to FIG. 5 which shows a timing chart for the RAM as a whole and FIG. 6 which shows a timing chart for the part illustrated in FIG. 4.

In the normal operation, namely, in the case where the restore signal RSTR is not activated, the restore signal RSTR is at high level, so that the intermediate signal WDE2 in the word for restore control circuit 63 (FIG. 4) maintains the low level. Accordingly, word line waveform W0 is omitted from FIG. 5 and FIG. 6.

When cell array block codes B0 and B1, address codes ARC8 and ARC9 and address codes ARC-0–ARC7 are supplied in synchronism with the row selection signal RAS, the block decoder 50 decodes the block code B0 and B1 to activate one of the decoders 20a–20d and one of the registers 80a–80d. The output of the block decoder 50 is also supplied to the column decoders 40a–40d. In order to facilitate the explanation, assume that the row decoder 20a and the register 70a, and thus the cell array block 10a, are selected and that another cell array block from 10b to 10d is thereafter selected.

Although the address codes ARC0–ARC7 are supplied to the row decoders 20a–20d via the selectors 80a–80d since the switching signal SW is at high level, they are validated only in the row decoder 20a. The address codes ARC0–ARC7 are further supplied to and then temporarily stored in the register 70a. The output of the register 70a is supplied to the selector 80a.

When the intermediate signal SE (FIG. 4) goes to low level, the sense-enable signals SAP and SAN become to have the same potential and the sense amplifier 30a is inactivated. At about the same time, a high level precharge signal PRC generated in the sense amplifier activation state hold circuit 64 (FIG. 4) is applied to the gate of an N-type MOS transistor 11 (FIG. 3), and the digit lines D and $\overline{D}$ are brought to an equal potential as shown in FIG. 5. This is a preprocessing for clearing the existing unbalance in the potentials on the digit lines D and $\overline{D}$ in preparation to a read signal in the memory cells.

When the precharge signal PRC returns to low level, the word line activating signal WDE goes to high level to energize the word line selected by the row decoders 20a in response to the address codes ARC0–ARC7. The selection of word line W1 causes the data stored in the memory cells (W1) to appear on the digit line D. When the read output corresponds to the binary digit "1", the digit line D goes to high level.

As the word line activating signal WDE rises, the sense amplifier activating signal SAP goes to high level while the signal SAN is being at the low level. As a result, since the potentials of the gates (connected to the digit line D) of P-type MOS transistor 32 and N-type MOS transistor 34 (FIG. 3) are at high level, P-type MOS transistor 32 is turned off and N-type MOS transistor 34 is turned on. Accordingly, the GND potential appears in the digit line $\overline{D}$ via the N-type MOS transistor 34. Since the GND potential is also the gate potential of P-type MOS transistor 31 and N-type MOS transistor 32, the former transistor is turned on while the latter is turned off.

As a result of the above operation, the potential of the digit line D goes to the power supply potential via the P-type MOS transistor 31. Owing to this operation, memory cell 12 (W1) is refreshed at the power supply voltage, and recovers the power supply potential even if the storage charge is lost by certain degree of volatilization by that time.

In synchronism with the column selection signal CAS, the output of the block decoder 50 and the address codes ARC0–ARC7, and ARC8 and ARC9 are supplied. At this time, only the column decoders 40a–40d can accept the block codes B0 and B1 and the address codes ARC0–ARC7, and further, differing from what happens at the time of input of the row selection signal RAS, the 2-bit address codes ARC8 and ARC9 can also be input to the column decoders 40a–40d. As a result, arbitrary one of the column decoders 40a–40d, including column decoder different from that at the time of input of the row selection signal RAS, can be selected, expanding the range of continuous access of page mode to four times that of the conventional range.

The column decoder chosen selects four out of the 4,096 digit lines of the concerned memory cell array by the 8-bit address codes ARC0–ARC7 and the 2-bit address codes ARC8 and ARC9. Namely, when the column selection line YSW of the column decoder 40a is selected and goes to high level in FIG. 3, the N-type MOS transistors 41 and 42 are energized, and the digit lines D and $\overline{D}$ are connected to the input and output lines I/O and $\overline{I/O}$, respectively. If the write enable signal WE is at low level in this case, the potentials on the digit lines D and $\overline{D}$ are led to the input and output lines I/O and $\overline{I/O}$ since the read operation is indicated, and are taken to the outside.

On the other hand, if the write enable signal WE is at high level, the write data externally input to the input and output lines I/O and $\overline{I/O}$ are led to the digit lines D and $\overline{D}$. However, as is clear from the waveforms of the word line potential in FIG. 5 and FIG. 6 as well as the generation logic of the word line activating signal WDE in FIG. 4, the word line potential drops so that writing to the memory cells at this time will not take place.

Execution of write to the memory cells is held as will be described later until another word line within the pertinent cell array block is accessed. That no inconvenience occurs even if such a processing is introduced is due to the fact, as shown in FIG. 5 and FIG. 6, that there is no change in the sense amplifier activating signals SAP/SAN and the sense amplifiers 30a–30d are held in the activated state so that the data on the digit lines D and $\overline{D}$ will not be lost. The generation logic of the sense amplifier activating signals SAP/SAN is clear from FIG. 4.

Accordingly, read of the memory cells on the digit lines D and $\overline{D}$ described in the above becomes feasible without carrying out the activation of the word line. This situation remains valid even if the system recurs to the same word line in a cell array block after access is shifted to another cell array block.

However, when an access to select another word line within the concerned cell array block is indicated, data on the digit lines D and $\overline{D}$ can no longer carry the identity by the execution of the access. In this case, the operating subject, for example, CPU of the concerned RAM activates the restore signal RSTR.

Figure 5:
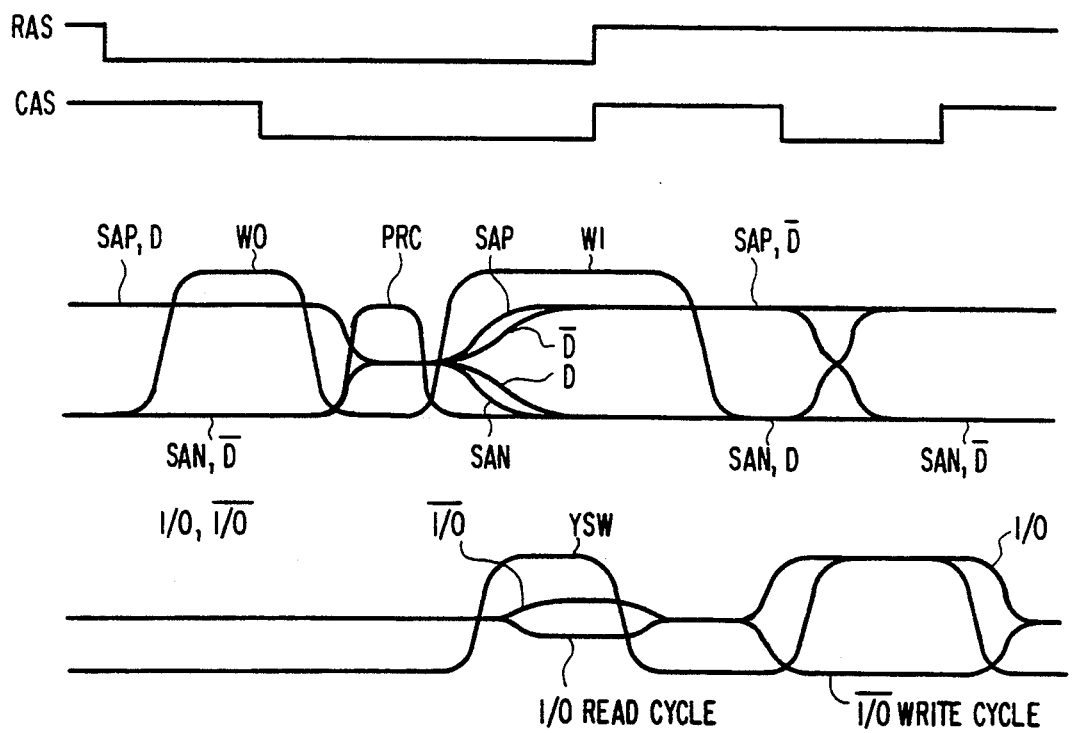
FIG. 5 is an overall timing chart for the embodiment shown in FIG. 2.
Figure 6:
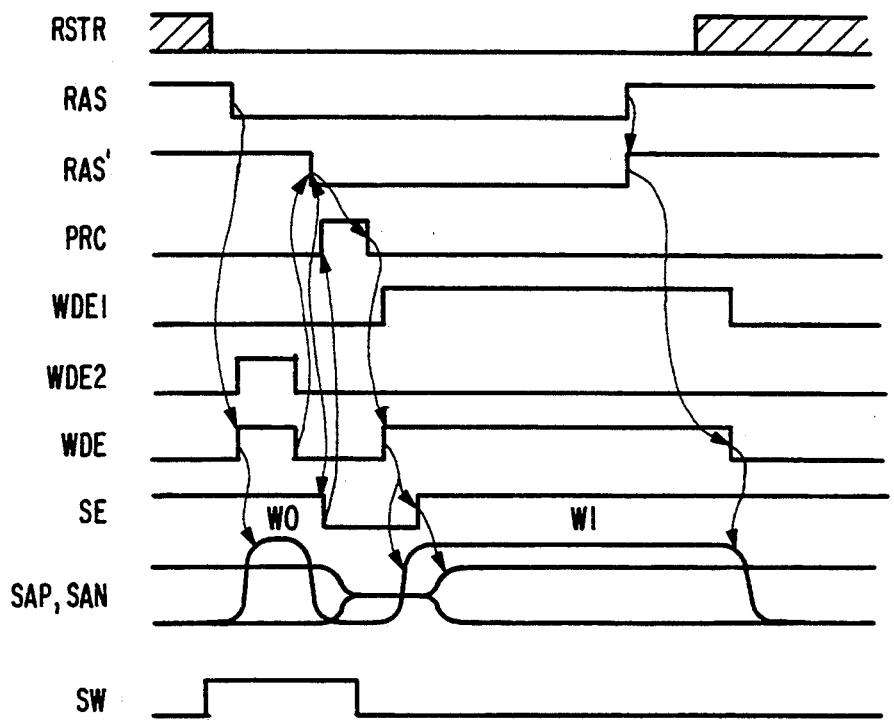
FIG. 6 is a timing chart for the principal part of the controller shown in FIG. 4.

The timing charts for the case when the restore signal RSTR goes to low level are as shown in FIG. 5 and FIG. 6. These figures show examples in which a memory cell to which writing is held is designated by the word line W0, and a newly accessed memory cell is designated by the word line W1. In this example, the switching signal SW to the selectors 80a–80d goes to low level as shown in FIG. 2, so the outputs of the registers 70a–70d are selected. Here, it is important to recall the description in the above that the registers 70a–70d hold the latest address codes ARC0–ARC7 to the cell array blocks 10a–10d that are synchronized with the row selection signal RAS.

When the address codes ARC0–ARC7 are led to the row decoders 20a–20d, word line W0 (FIG. 5 and FIG. 6) starts to rise, data held in the digit lines D and $\overline{D}$ are written to the memory cells, and the write operation which has been held is executed. The rise of the word line W0 in this case is necessary for the excitation of the memory cells, differing from the case of read of digit lines D and $\overline{D}$ to which write has been held.

Following the restore operation in the above, aforementioned normal operation is carried out.

Next, a second embodiment of the invention will be described.

Figure 8:
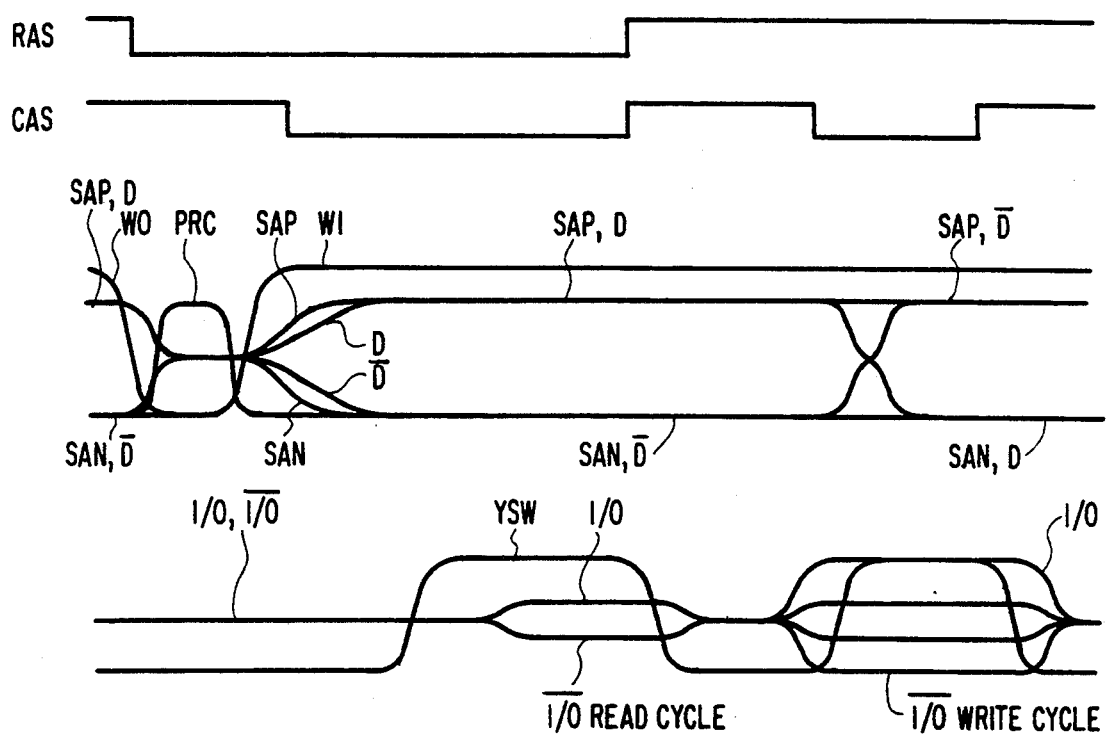
FIG. 8 is an overall timing chart for the second embodiment of the invention.

The second embodiment has a feature in that it operates according to the timing chart as shown in FIG. 8 and the potential of the word line is held until the next row selection signal RAS is activated. As a result, when the write operation is indicated, write is executed immediately without holding the write operation to the memory cells as was the case in the first embodiment. Accordingly, this point does not differ from what happens in the prior art, but the point that the sense amplifiers maintain the activated condition even after the completion of the access operation is different from the prior art. Further, the potential of the word line is held at high potential even after the completion of one memory cycle until another word line is selected, so that the write operation in page mode becomes possible. Accordingly, in the second embodiment, the selectors that correspond to the selectors 80a–80d among the components in the first embodiment become unnecessary. The registers 70a–70d in this case do not function for restoring as in the first embodiment, but are for holding the potential of the selected word line as mentioned above.

Figure 7:
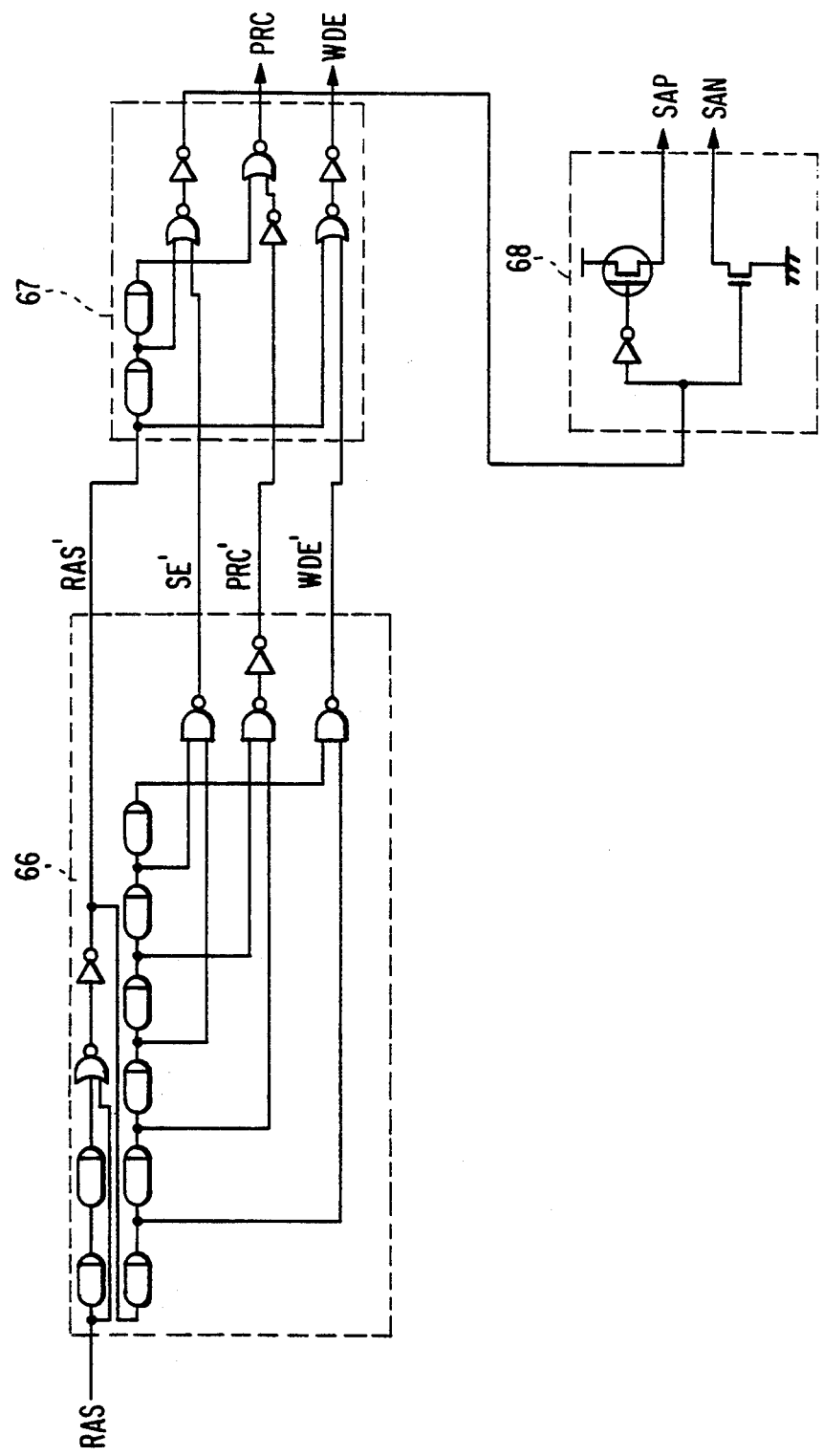
FIG. 7 is a detailed circuit diagram for the principal part of the controller in the second embodiment of the invention.

Referring to FIG. 7 showing a detailed circuit for the principal part of the controller 61, this circuit consists of an RAS system timing generation circuit 66 which generates intermediate signals RAS', SE', PRC' and WDE' from the row selection signal RAS, a sense amplifier activation state hold circuit 67, provided corresponding respectively to the cell array blocks 10a–10d, which generates an intermediate signal SE, a precharge signal PRC and a word line activating signal WDE in response to the intermediate signals RAS', SE', PRC' and WDE', and a sense amplifier activation circuit 68, provided corresponding respectively to the cell array blocks 10a–10d, which generates sense amplifier activating signals SAP and SAN in response to the intermediate signal SE. The supply destinations of the various signals generated are the same as in the first embodiment.

In the first embodiment, when executing memory access of data other than the held data of the sense amplifiers 30a–30d, the memory access is executed after carrying out write (restore) of the held data of the sense amplifiers 30a–30d to the memory cells. In contrast, in the second embodiment, restoring becomes unnecessary since the writing of the held data of the sense amplifiers 30a–30d to the memory cells is already completed, and the memory access time can be reduced accordingly.

Although both of the first and the second embodiments have been shown with reference to dynamic MOS memories which occupy currently more than half of the mass storage RAMs, this invention is applicable also to the static RAMs.

As has been described in the above, RAM according to the invention includes sense amplifiers that are normally activated, and when accessing data existing in the sense amplifiers, it is unnecessary to activate the sense amplifiers. Moreover, this invention has an effect of expanding the cell address range that is quickly accessible through the introduction of the block decoder that can designate mutually different cell array blocks synchronized with the row selection signal RAS and the column selection signal CAS.

Although the invention has been described with reference to specific embodiments, this description is not meant to be construed in a limiting sense. Various modifications of the disclosed embodiment will become apparent to persons skilled in the art upon reference to the description of the invention. It is therefore contemplated that the appended claims will cover any modifications or embodiments as fall within the true scope of the invention.

What is claimed is:

1. A semiconductor memory, comprising: a plurality of memory cell array blocks each having a plurality of word and digit lines, a plurality of row decoders each provided for an associated one of said memory cell block, a plurality of column decoders each provided for an associated one of said memory cell array blocks, a plurality of amplifiers provided for an associated one of said memory cell array blocks, and for holding data on at least one of said digit lines in a selected one of said memory cell array blocks, and a block decoder for selecting said memory cell array blocks in sequence.

2. The semiconductor memory as claimed in claim 1, further comprising: a plurality of registers provided for an associated one of said memory cell array blocks, each of said registers temporarily storing address information for selecting one of said word lines in the corresponding one of said memory cell array blocks, and a plurality of selectors provided for an associated one of said memory cell array blocks and receiving a restore signal, each of said selectors selecting and supplying address information provided to said selectors in synchronism with a row selection signal to said the corresponding one of said row decoders when said restore signal is at a first level and selecting and supplying the address information stored in said register to said corresponding row decoder when said restore signal is at a second level.

3. The semiconductor memory as claimed in claim 1, further comprising: a plurality of registers each provided for an associated one of said memory cell array blocks, each of said registers temporarily storing address information for selecting a word line which was selected by a latest access.

4. A memory device, comprising:
a memory cell array including a plurality of word lines, a plurality of digit lines, and a plurality of memory cells each connected to one of said word lines and one of said digit lines;

a plurality of sense amplifiers each coupled to an associated pair of said digit lines;

first decoder means responsive to first address information for driving one of said word lines from a non-selection level to a selection level to cause a potential difference responsive to data stored in each of the memory cells connected to said one of said word lines to appear between an associated one of said pairs of digit lines;

activation means for activating each of said sense amplifiers to cause each of said sense amplifiers to amplify the potential difference appearing between the associated one of said pairs of digit lines;

second decoder means responsive to second address information for selecting at least one of said pairs of digit lines;

maintaining means for maintaining an activation of each of said sense amplifiers after said one of said word lines is changed from said selection level to said non-selection level to thereby allow at least one of said sense amplifiers coupled to said at least one of said pairs of digit lines selected by said second address information to accept data to be written and to provide between said one of said pairs of digit lines a potential difference responsive to said data to be written; and control means responsive to a control signal for causing said first decoder means to drive again said one of said word lines from said non-selection level to said selection level so that said data to be written is written into at least one of said memory cells designated by said first and second address information.

5. The memory device as claimed in claim 4, wherein said control means comprises:

a register for temporarily storing said first address information; and means responsive to said control signal for transferring said first address information from said register to said first decoder means to cause said first decoder means to drive again said one of said word lines from said non-selection level to said selection level.

* * * * *

UNITED STATES PATENT AND TRADEMARK OFFICE
CERTIFICATE OF CORRECTION

PATENT NO. : 5,367,495
DATED : November 22, 1994
INVENTOR(S) : Toru Ishikawa

It is certified that error appears in the above-indentified patent and that said Letters Patent is hereby corrected as shown below:

Col. 6, line 35, delete "and I/O", insert -- I/O --

Col. 6, line 38, delete "and I/O", insert -- I/O --

Signed and Sealed this

Eleventh Day of July, 1995

Attest:

BRUCE LEHMAN

Attesting Officer    Commissioner of Patents and Trademarks